United States Patent [19]

Nagazumi

[11] Patent Number: 5,537,115
[45] Date of Patent: Jul. 16, 1996

[54] ANALOG-TO-DIGITAL CONVERTER

[75] Inventor: Yasuo Nagazumi, 6-14-20 Ootsuka, Bunkyo-ku, Tokyo, Japan

[73] Assignees: Yasuo Nagazumi; G.D.S. Co., Ltd., both of Japan; a part interest

[21] Appl. No.: 250,398

[22] Filed: May 27, 1994

[30] Foreign Application Priority Data

Jun. 2, 1993 [JP] Japan .................................. 5-154513
Jun. 2, 1993 [JP] Japan .................................. 5-154514

[51] Int. Cl.$^6$ ................................................. H03M 1/12
[52] U.S. Cl. .......................................... 341/172; 341/155
[58] Field of Search .................................... 341/172, 127, 341/163, 128, 129, 155, 164, 167, 168, 159

[56] References Cited

U.S. PATENT DOCUMENTS 4,072,939  2/1978  Heller et al. .
4,306,221  12/1981  Jiang et al. ............................ 341/155

FOREIGN PATENT DOCUMENTS 52-106261  1/1977  Japan .

OTHER PUBLICATIONS

Geiger, Randall L., et al.; *VLSI Design Techniques for Analog and Digital Circuits;* pp. 612–667; 1990.

Primary Examiner—Brian K. Young
Attorney, Agent, or Firm—King & Schickli

[57] ABSTRACT

Analog memories such as CCD, which are advantageous in less power consumption and higher integration density, are used to configure a system for highly accurately executing analog/digital processing. An analog to digital converter according to the invention has at least one first analog memory having an input port for receiving input signal packets and a partial output drive port for driving the i-th output signal packet; at least one second analog memory having a function to integrate input signal packets applied thereto; and at least one signal packet routing mechanism for selectively routing output signal packets from the first analog memory according to an input digital signal bit. The extremely simple configuration of the present invention may be effectively utilized for realizing an ultra-parallel analog processor as well as applied to other fields such as video processing by combining a function of an input means for optical signals, which has been a main application of the CCD.

5 Claims, 8 Drawing Sheets

BASIC ELEMENTS

RECURSIVE DIVIDER

ANALOG-TO-DIGITAL CONVERTER

BACKGROUND OF THE INVENTION

1. Field of the Invention

The present invention relates to analog/digital information processing, and more particularly to analog-to-digital converting techniques by use of analog memories.

Although the present invention is principally utilized in A/D converters and particularly described herein in connection therewith, it should be understood that the present invention may be widely applied to a signal processor and so on.

2. Description of the Related Art

While analog memory devices represented by a charge coupled device (CCD) and other charge transfer devices (CTD) have been widely spread in the form of imaging devices and delay lines, they are merely applied to limited fields of their original uses such as analog shift registers, analog memories and so on. Although the utilization of these analog memory devices in matched filters and multi-value logic circuits have been investigated, very few applications have been actually realized in the field of such signal processing.

In general, the CCD has excellent characteristics such as less power consumption and high density of integration, so that the establishment of higher signal processing functions such as A/D conversion has been expected. However, no application has been so far reported for A/D conversion.

Although not included in the charge transfer device, there has been proposed and commercialized a method of realizing D/A and A/D conversion based on the charge scaling principle by applying "a switched capacitor circuit" which utilizes capacitance for an analog memory to perform signal processing (FIG. 1). However, with the switched capacitor circuit, it is indispensable to repetitively recharge and discharge capacitors in the circuit using a stable voltage source, so that required power consumption is much larger than that of the charge transfer device such as CCD. For this reason, it is generally thought that the implementation of the switched capacitor circuit in a high density integrated circuit and the enhancement of the operating speed are limited. The switched capacitor circuit further implies a number of disadvantages. For example, it cannot execute A/D conversion with a charge signal used directly as an input signal. For further details about the switched capacitor circuit, refer to an article entitled "VSLI design techniques for analog and digital circuits", by R. L. Geiger et al, McGRAW-HILL (Electronic Engineering Series), pp. 612–667 (1990).

SUMMARY OF THE INVENTION

In view of the above-mentioned problems of the prior art, it is a principal object of the present invention to provide a circuit which is capable of realizing a highly accurate A/D conversion with a simple configuration by directly deriving a digital signal from a charge signal transmitted by a charge transfer device.

To achieve the above object, the present invention provides an analog to digital converter comprising: at least one first analog memory means having an input port for receiving reference signal packets (U) and a partial output drive port for driving the i-th output signal packet (Qout(i)) defined by:

$$Qout(i) = U \cdot (1-a)^{i-1} \cdot a$$

where a is a value satisfying $1 > a > 0$, and $i = 1, 2, 3 \ldots$; at least one second analog memory means; at least one detector means for detecting the contents of the analog memory means, the detector means having comparator means for relatively comparing simultaneously or successively generated two or more output values of said detector means; and a structure for successively determining an output digital signal bit from an output of the comparator means, wherein an output of the recursive divider is selectively added to either of an input signal stored in one of the analog memory means in an initial state and a signal representative of a reference value stored in the other of the analog memory means in the initial state, depending on the value of a determined digital signal bit.

Since the circuit according to the present invention is formed by fewer elements, a greater number of the circuits can be incorporated in an integrated circuit. This leads to the formation of a massively parallel A/D converter which can be applied, for example, to the field of image processing.

The above and other objects, features and advantages of the present invention will be more apparent from the following detailed description of the preferred embodiment when read in conjunction with the accompanying drawings.

DESCRIPTION OF THE PREFERRED EMBODIMENTS

The present invention will hereinafter be described in connection with the preferred embodiments thereof with reference to the accompanying drawings.

Figure 1:
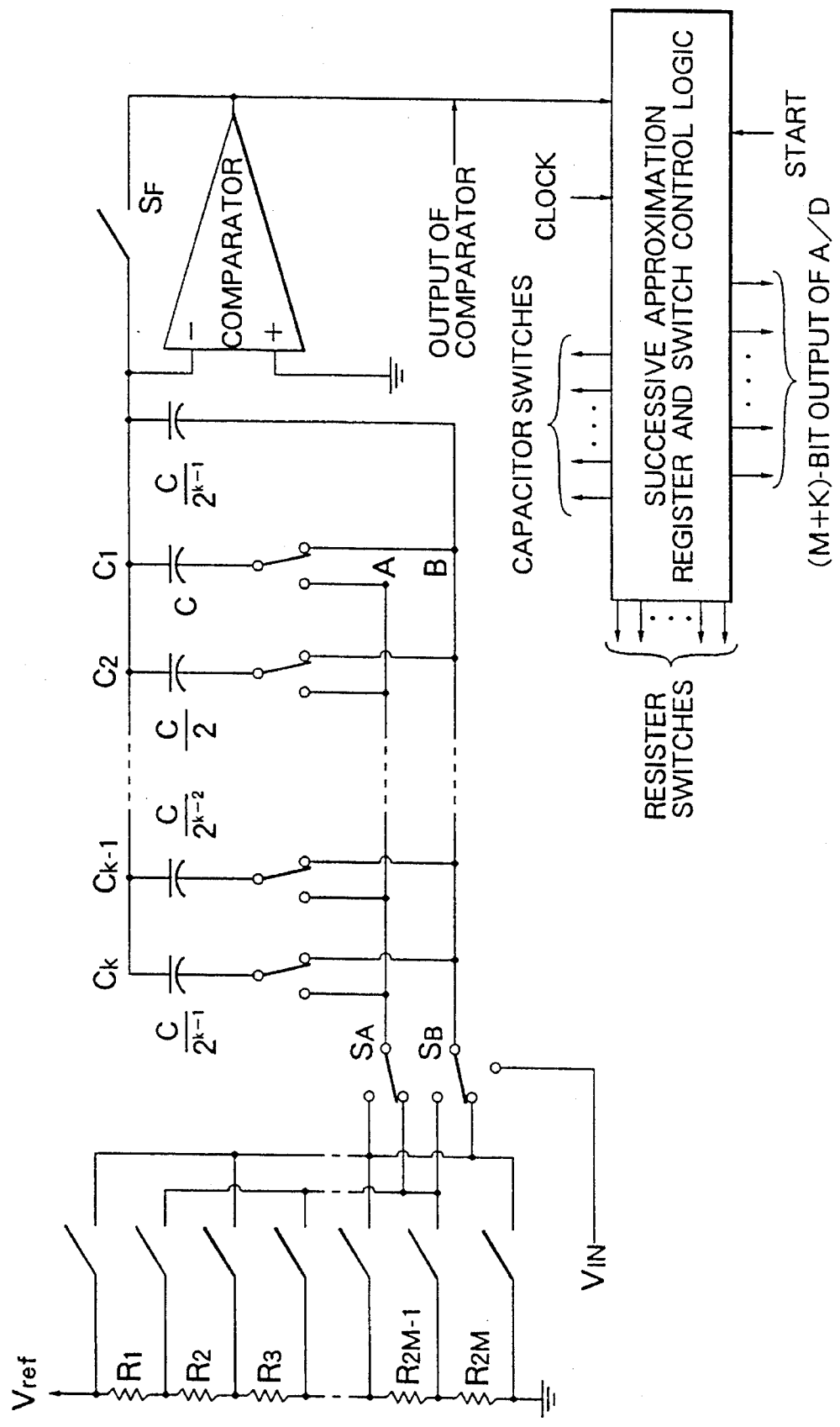
FIG. 1 is a circuit diagram showing a prior art A/D converter to which a switched capacitor circuit is applied.
Figure 2:
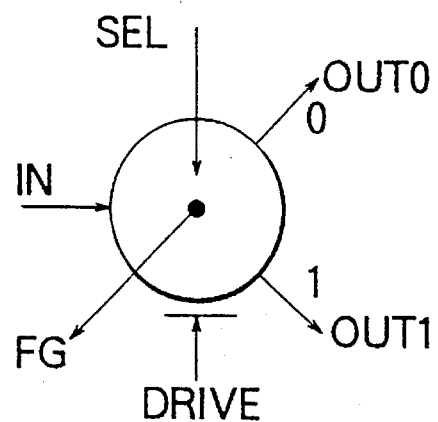
FIGS. 2A–2C show in schematic diagram form functional elements which constitute the circuits of the present invention.
Figure 2:
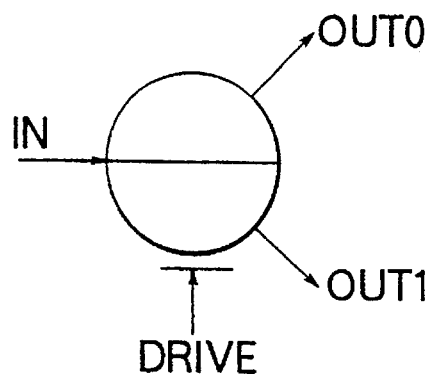
Figure 2:
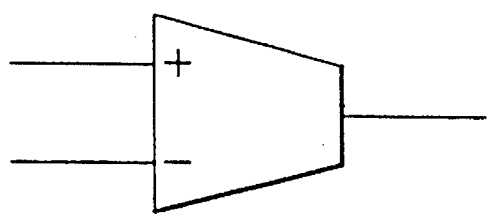

FIGS. 2A–2B show symbols and functions of functional elements which constitute the present invention. Specifically, FIG. 2A illustrates a buffer gate (BG) having an output selection function. As illustrated, a signal inputted from an input port IN is added to a signal which has already been held in the buffer gate. The signal held in the gate is all outputted from either of output ports OUT0 and OUT1 in response to an output control signal DRIVE. However, the selection of the output port is made by an output selecting signal SEL. It will be of course understood that a buffer gate having a single output port does not require the SEL input.

In the illustrated example, the buffer gate is provided with a sensing port FG for measuring the amount of signal held in the gate and transmitting a signal indicative of the measured amount to the outside.

FIG. 2B illustrates a signal dividing gate (DG). A signal inputted from an input port IN is all delivered from output ports OUT0 and OUT1 in response to an output control signal DRIVE, wherein the ratio of the amounts of the two output signals delivered from the ports OUT0 and OUT1 indicates substantially a constant value.

FIG. 2C illustrates a signal comparator unit (SC). This is similar to conventional comparators known to those skilled in the art, so that detailed explanation thereof will be omitted.

FIGS. 3A–3G illustrate examples of recursive dividers (RD) utilizing the signal dividing gate of FIG. 2B and the operation thereof.

Figure 3:
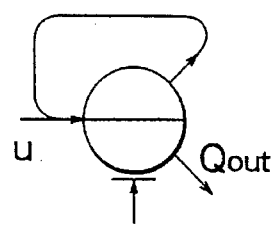
FIG. 3A is a schematic diagram showing an embodiment of a recursive divider according to the present invention.
FIG. 3B illustrates a specific configuration of a recursive divider of the type shown in FIG. 3A employing CCD as an analog memory.
FIG. 3C schematically illustrates the operation of the recursive divider according to the present invention.
FIG. 3D is a schematic diagram showing another embodiment of the recursive divider according to the present invention.
FIG. 3E illustrates an exemplary configuration of the recursive divider shown in FIG. 3D employing CCD's.
FIG. 3F shows a symbol representing the function of the recursive divider.
Figure 3:
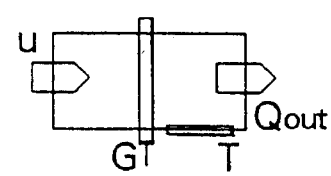
Figure 3:
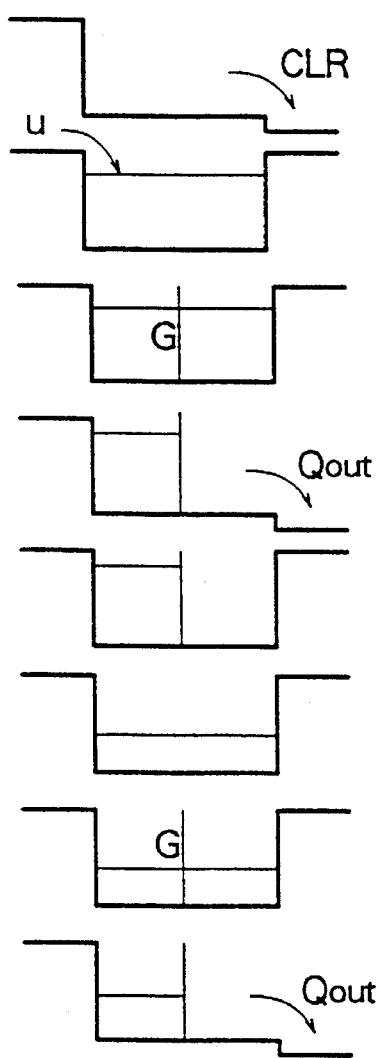
Figure 3:
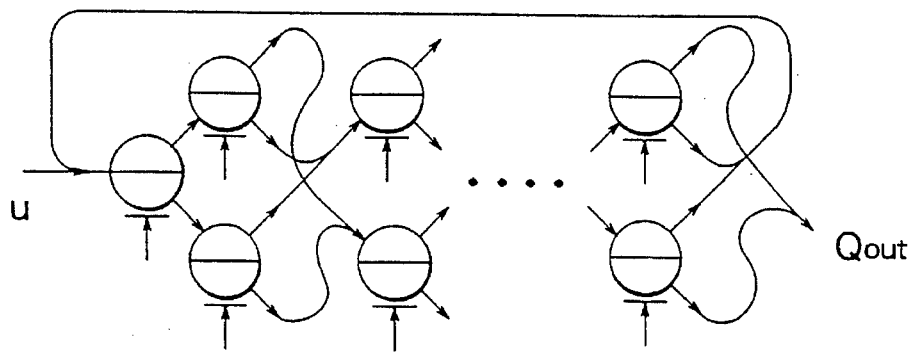
Figure 3:
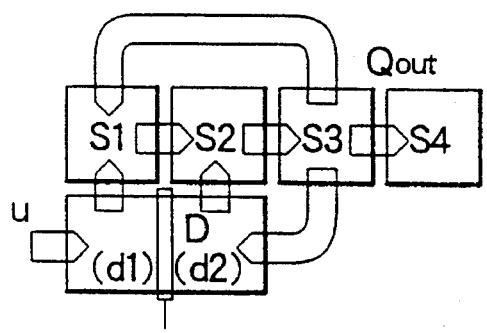
Figure 3:
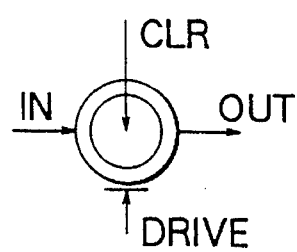

More specifically, in FIG. 3A showing the basic configuration of a recursive divider, one of two output signals delivered from a dividing gate is directed to the outside, whereas the other output is again used as an input to the dividing gate. For this reason, assuming that the output ratio of the dividing gate is represented by (1−a):a, the i-th output QOUT of the dividing gate is expressed by the following equation (1):

$$QOUT(i)=U\cdot(1-a)^{i-1}\cdot a \qquad (1)$$

where U is the initial signal amount, and a is a value larger than zero and smaller than one (1>a>0).

In the equation (1), if a is assumed to be ½, the equation (1) is of course simplified as expressed by the following equation (2):

$$QOUT(i)=U\cdot(\tfrac{1}{2})^i \qquad (2)$$

FIG. 3B shows an example of a configuration which utilizes CCD as an analog memory and locates a separation gate G at a position where the area of the separation gate G is substantially equally divided into two, such that charge signals are repetitively divided into two equal portions. An electrode T shown in the drawing is an adjusting electrode provided for finely adjusting the dividing ratio of signals and is structured to control the area ratio of the gate by use of an external electric field.

It should be noted here that while there are a variety of specific forms for realizing data transfer between analog memories, e.g., three-phase type, four-phase type and so on only for the CCD, the difference among these forms is not related to the essence of the present invention. Since the complexity caused by these different forms merely prevents the understanding of the present invention, the data transfer will be represented by fat arrows in the explanation below.

FIG. 3C schematically shows a series of the operation of a recursive divider. In the topmost figure, the recursive divider is initialized by discharging all signals contained therein. In the second figure representing the second stage, an input signal is injected into the recursive divider. In the third figure or the third stage, the input signal is divided by a gate G in a predetermined ratio, where one-half the input signal is discharged while the rest is redistributed over the whole recursive divider when the gate G is removed.

The foregoing equation (1) is realized by repeating the division, discharge and redistribution.

FIG. 3D shows an alternative idea for configuring an accurate recursive divider (a=½) by using a multiplicity of dividing gates. Assuming that all dividing gates in the drawing output (½+x) and (½−x) of signals held in the respective dividing gates (x is an error coefficient), the outputs of the dividing gate at the first stage are expressed by the following equation (3):

$$Q(1)=U\cdot(\tfrac{1}{2}+x)$$
$$Q'(1)=U\cdot(\tfrac{1}{2}-x) \qquad (3)$$

If these outputs are further divided by dividing gates in the next stage, Q(1) is divided into Q00 and Q01, while Q'(1) into Q10 and Q11. Thus, the following four signals are outputted:

$$Q00=U\cdot(\tfrac{1}{2}+x)\cdot(\tfrac{1}{2}-x)$$
$$Q01=U\cdot(\tfrac{1}{2}+x)\cdot(\tfrac{1}{2}-x)$$
$$Q10=U\cdot(\tfrac{1}{2}-x)\cdot(\tfrac{1}{2}+x)$$
$$Q11=U\cdot(\tfrac{1}{2}-x)\cdot(\tfrac{1}{2}-x) \qquad (4)$$

Then, each two of the four signals are next collected as expressed by the following equations (5):

$$Q(2)=Q00+Q11=U\cdot(\tfrac{1}{2}+2x^2)$$
$$Q'(2)=Q01+Q10=U\cdot(\tfrac{1}{2}-2x^2) \qquad (5)$$

It will be understood from the foregoing equations that $x>2x^2$ is satisfied when $0<|x|<0.5$, and that an error in the results is ensured to be gradually improved.

The error is improved as the foregoing processes are repeated and, as a result, expressed generally by the following equations (6):

$$Q(i)=U\cdot\{1+(2x)^i\}/2$$
$$Q'(i)=U\cdot\{1-(2x)^i\}/2 \qquad (6)$$

FIG. 3E shows an example of a configuration for realizing the processes executed by the configuration illustrated in FIG. 3D, the operation of which will be explained later with reference to FIG. 4. It is assumed hereinafter that the function of the above-mentioned recursive divider is represented by a symbol shown in FIG. 3F.

Figure 4:
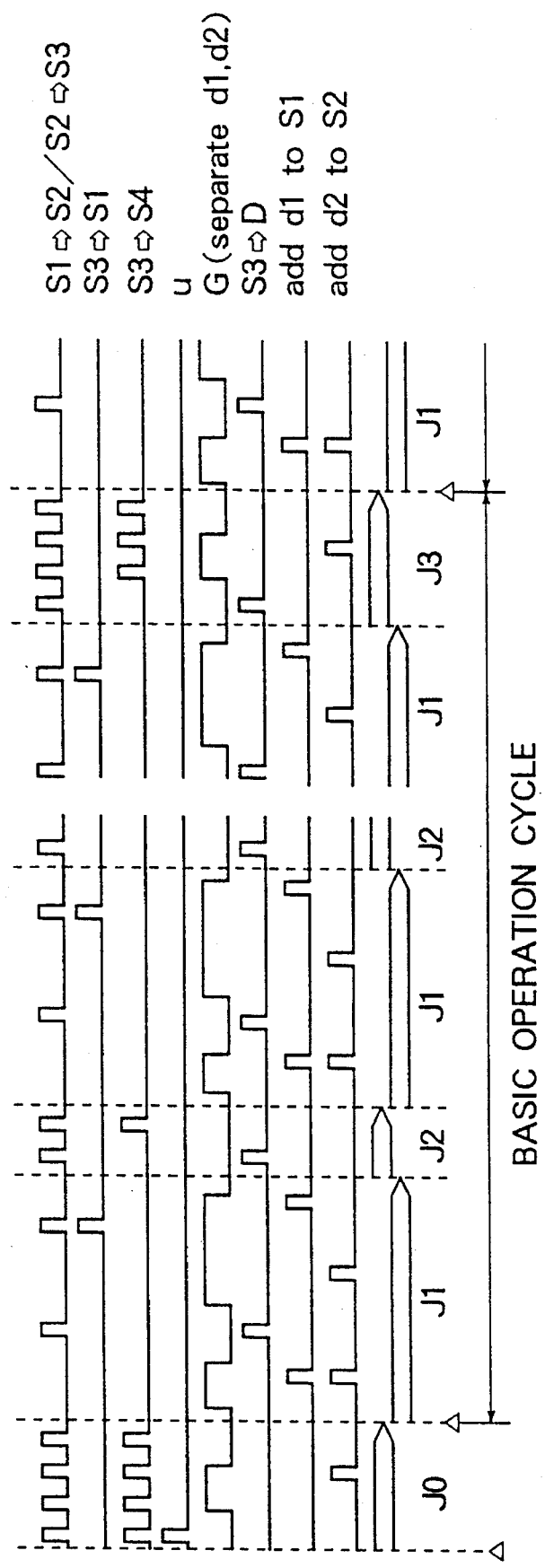
FIG. 4 shows timing charts used for explaining the operation of the recursive divider of FIG. 3E.

FIG. 4 shows the operation of the multiple division type recursive divider in accordance with the configuration of FIG. 3E with respect to the time.

The configuration shown FIG. 3E comprises a recursive shift register including three buffer gates S1, S2, S3, each functioning as a memory and an output buffer gate S4. The operation of the whole configuration is made up of a combination of an input phase J0, division phases J1, J2, and an output phase J3.

More specifically, input charges are transferred to a dividing gate D at a timing of the first pulse. The dividing gate D divides the input charges into two segments on d1, d2, respectively, and the segment on d2 only is transmitted to a memory S2, the contents of which are moved into a memory S3 by its shift operation. In the meantime, the dividing operation of the dividing gate D is removed, the segment on d1 is re-distributed to the entire part of the dividing gate D, whereby the second division is ready.

The second division is made up of two phases. In the first phase, the signal remaining in the dividing gate D is again divided into segments on d1, d2 which are accumulated in the memories S1, S2, respectively. Then, the segment on d2 held in the memory S3 as the result of the first division is again transferred to the dividing gate D by a shift operation.

In the second phase, the contents of the dividing gate D, i.e., the segment on d2 resulted from the first division, is again divided into two segments on d1, d2. The second segment on d2 is added to the contents of the memory S2, while the second segment on d1 is added to the contents of the memory S1 by an additional shift operation, thus forming an output. Simultaneously with this operation, two shift operations are executed for the next division.

With this configuration, after the processing of the division phases J1+J2 have been executed a number of times determined by a required accuracy of division, the first part of the division phase J1 and the output phase J3 are further executed to complete a division output. While more processing time is taken for a higher accuracy required, no additional processing such as calibration is necessary, so that the hardware configuration can be made simple. In addition, the accuracy of division may be selected depending on its applications.

Figure 5A:
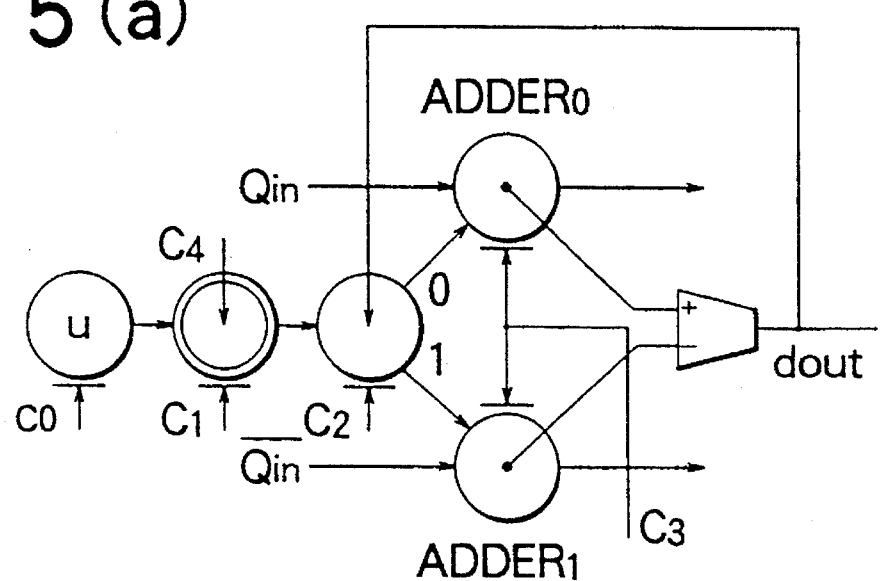
FIG. 5A shows an example of an A/D converter for converting a differential analog input signal to a digital signal.
Figure 5B:
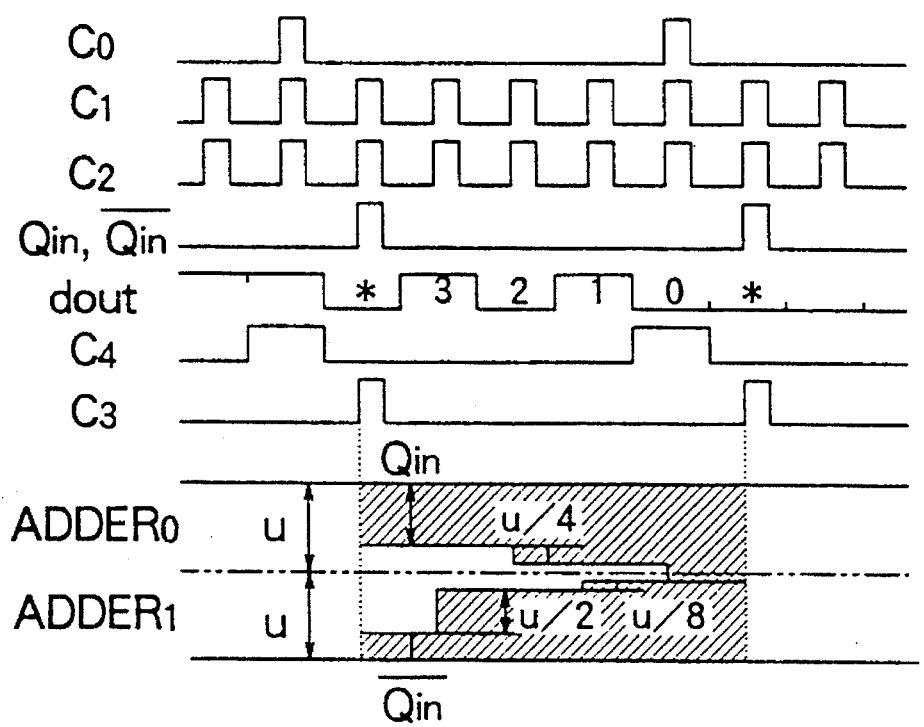
FIG. 5B shows timing charts representing the operation of the A/D converter of FIG. 5A.
Figure 6:
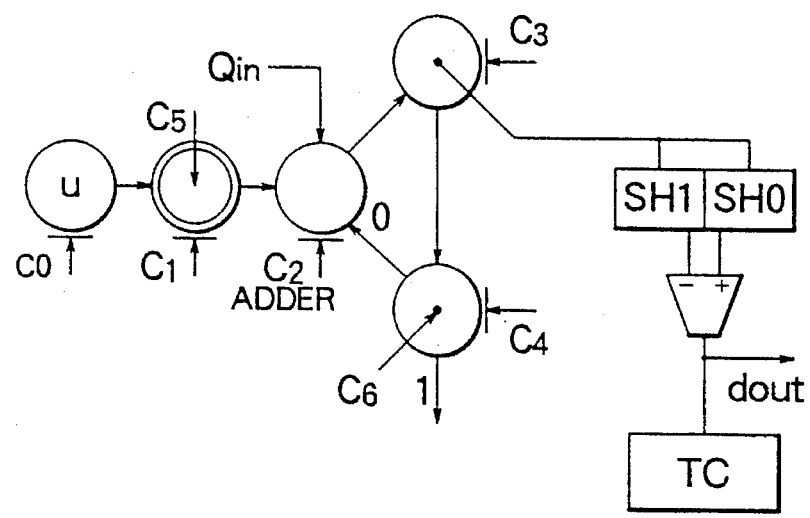
FIG. 6 shows an example of a successive approximation type A/D converter.
Figure 7:
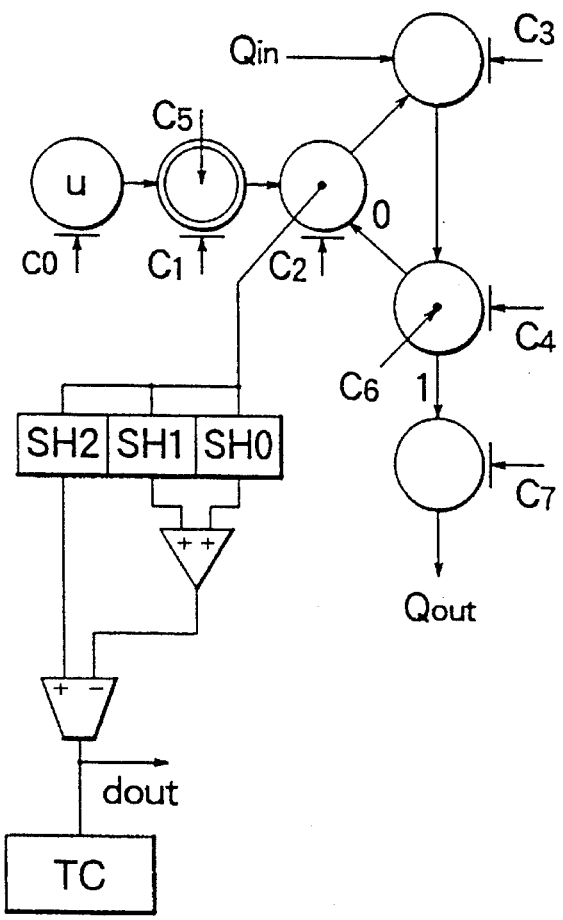
FIG. 7A shows another example of the successive approximation type A/D converter.
FIG. 7B shows timing charts representing the operation of the A/D converter of FIG. 7A.

FIGS. 5–7 show specific examples of such successive approximation type A/D converters.

Specifically, FIG. 5A shows an example of an A/D converter for converting a differential analog input signal to a digital signal. In the drawing, reference letter u designates a reference signal source.

In this example, two adders ADDER0, ADDER1 are supplied with differential signals QIN, $\overline{QIN}$ which serve as input signals in an initial state of the conversion. The amounts of signals held by these adders are always measured by a sensing port FG provided in each of the adders.

A digital output is determined on the basis of a comparison as to the magnitudes of outputs from the respective sensing ports FG. Simultaneously, this digital output is also used to determine which of the two adders an output from the recursive divider is added to. It should be noted that the characteristics of the sensing ports FG provided in the respective adders are required to have strictly coincident characteristics since they directly affect the accuracy of the digital conversion.

The operation will be explained with reference to timing charts of FIG. 5B.

First, a reference signal u is transferred to the recursive divider, and then the differential signals QIN, $\overline{QIN}$ are inputted to the respective adders ADDER0, ADDER1, thus starting the A/D conversion.

In the illustrated operation, it is assumed that the values of the input signals satisfy $QIN = u \cdot (10.5/16)$, $\overline{QIN} = u \cdot (5.5/16)$, so that the initial digital output is one which is the most significant bit (MSB) of the output.

The digital output is employed for selecting an output path of a branch buffer gate. Since the first output of the recursive divider $8/16$ is accumulated in ADDER1, the amounts of signals held by ADDER0 and ADDER1 are changed to $u \cdot (10.5/16)$ and $u \cdot (13.5/16)$, respectively. As a result, the digital output is changed to zero.

This causes the next output of the recursive divider $4/16$ to be accumulated in ADDER0, whereby the held amounts of signals are again changed to $u \cdot (14.5/16)$ and $u \cdot (13.5/16)$, respectively.

By repeating the foregoing processes, the digital output is determined, and (1010) is consequently outputted. This indicates that the value of the input signal is $10/16$ as large as the reference signal. It is understood that this is an approximation of the actual input $10.5/16$.

While the above example is given on the assumption that an input is converted to a four-bit digital signal, a digital output of an arbitrary bit length can be actually generated in principle depending on the accuracy of the recursive divider.

FIG. 6 shows an example of a successive approximation type A/D converter.

In FIG. 6, sample and hold means SH0, SH1 are provided for storing an output from a sensing port. Since the basic principle of the operation is the same as that of the example shown in FIG. 5, explanation thereof will be omitted. However, the configuration of this example has only one signal path, and there is only one sensing port provided, so that it is not necessary to adjust strictly the sensitivity of signal packet measuring means, as is the case of FIG. 5. Therefore, the configuration of FIG. 6 has an advantage that the management of the device accuracy is facilitated during mass producing processes.

FIG. 7A shows another embodiment of an A/D converter according to the present invention which has a configuration similar to that of the example shown in FIG. 6.

Since the foregoing examples shown in FIGS. 5 and 6 are each configured such that digital output bits are determined while input signals are being processed, the input signals cannot be utilized again. In contrast, the example shown in FIG. 7A has a configuration for processing input signals in non-destructive manner. In the configuration shown in FIG. 7A, a sensing port employs three sample and hold circuits for storing signals held in three slots constituting a recursive shift register. A bit pattern outputted from the A/D converter is determined by a comparison of an output of one of the three sample and hold circuits with the sum of outputs of the remaining two sample and hold circuits.

Figure 7B:
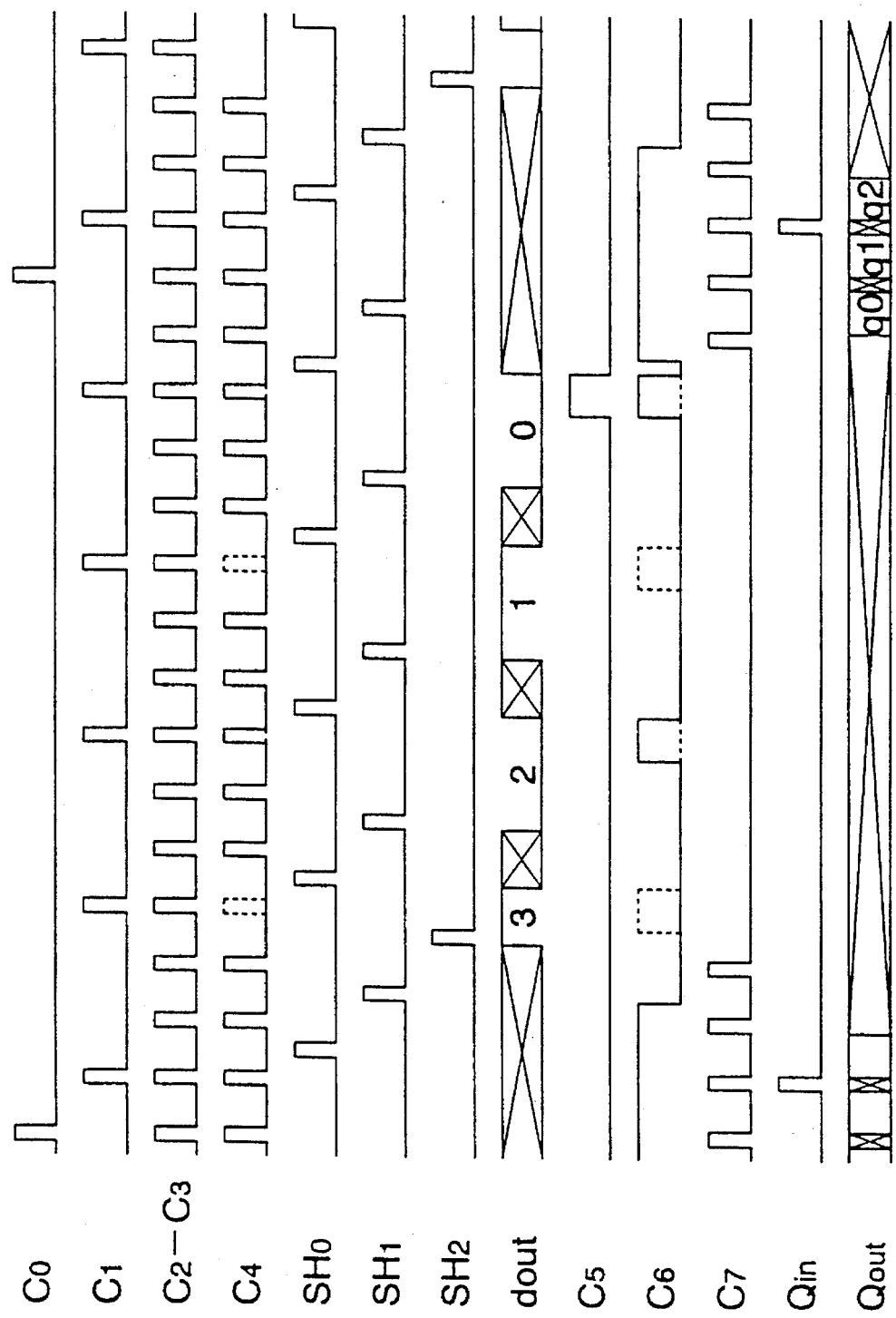

The operation of the A/D converter shown in FIG. 7A will next be explained in detail with reference to timing charts of FIG. 7B. First, a reference signal u injected into a recursive divider by C0 is sequentially divided in accordance with C1 and preliminarily stored into a predetermined slot in the recursive shift register (this slot will hereinafter be referred to as the preliminary slot). An input signal Qin, on the other hand, is injected into a slot referred to as "an input slot" different from the above-mentioned slot in an initial state and circulated in the recursive shift register. Since this slot is constructed in such a manner that neither injection nor discharge of signals occurs therein until a conversion is completed, data injected in this slot is transferred with the original amount of the signal being maintained. The remaining slot is referred to as "an accumulative slot" which is cleared in an initial state.

Assuming herein that the input signal Qin has a value $u \cdot (10.5/16)$ similarly to the above-mentioned example, signal amounts u·(⁸⁄₁₆), u·(¹⁰·⁵⁄₁₆) and u·(⁰⁄₁₆) are held in the preliminary slot, input slot and accumulative slot, respectively in the initial state.

As a result, (10.5)>(8+0) is derived, whereby the first bit (MSB) is determined to be one. When the bit is set to one, the shift of preliminary slot is inactive once as indicated by broken-line pulses in the timing chart of C4, with the result that the signal on the preliminary slot is added to the accumulative slot.

Conversely, when the bit is set to zero, the contents of the preliminary slot is accumulated in a different buffer gate provided out of the loop under the control of C6.

Since the bit indicates one in this case, the preliminary slot holds u·(⁴⁄₁₆); the input slot u·(¹⁰·⁵⁄₁₆); and the accumulative slot u·(⁸⁄₁₆) at the time the next output of the recursive divider is injected. Thus, (10.5)<(4+8) is derived, causing the second bit to be determined to be zero.

Repeating the foregoing processes a number of times equal to the number of bits, a digital pattern (1010) is outputted.

From this A/D converter, three analog outputs q0, q1, q2 are discharged in accordance with an output drive signal after the conversion has been completed. These analog outputs are composed of the input signal Qin, Qin' which is a quantized version of Qin, and a signal indicative of a complement signal of Qin'.

From the foregoing, it will be appreciated that with the present invention, analog memories such as CCD, advantageous in less power consumption and higher integration density, may be used to configure a system for highly accurately executing the analog to digital conversion which has conventionally been relatively difficult.

What is claimed is:

1. An analog to digital converter comprising:
   at least one first analog memory means (x) having an input port for receiving reference signal packets (u) and a partial output drive port for outputting the i-th output signal packet ($Q_{out}$ (i)) defined by:

$$Q_{out}(i) = U \cdot (1-a)^{i-1} \cdot a$$

where a is a value satisfying 1>a>0, and i=1, 2, 3 ... ;
   at least two second analog memory means (Y) having a function to accumulate input signal packets applied thereto, said at least two second analog memory means (Y) being connected to said at least one first analog memory means (x) so as to receive the i-th output signal packets outputted thereby;
   at least two signal packet measuring means for measuring the size of the signal packets stored in said two second analog memory means (Y);
   at least one signal comparator means for comparing outputs of said two signal packet measuring means and generating digital output bits (d(i)); and
   a signal packet routing mechanism for selectively routing output signal packets from said first analog memory means (x) to one of said second analog memory means (Y) according to an output digital signal from said at least one signal comparator means.

2. An analog to digital converter comprising:
   at least one first analog memory means (x) having an input port for receiving reference signal packets (u) and a partial output drive port for outputting the i-th output signal packet ($Q_{out}$ (i)) defined by:

$$Q_{out}(i) = U \cdot (1-a)^{i-1} \cdot a$$

where a is a value satisfying 1>a>0, and i=1, 2, 3 ... ;
   at least one recursive shift register including at least two second analog memory means (Y) wherein signal packets are allowed to be transferred in re-circulating manner, constructing virtual memory media that rotate virtually on said recursive shift register, said at least one of said at least two second analog memory means (Y) being connected to said at least one first analog memory means (x) so as to receive the i-th output signal packets outputted thereby;
   at least one signal packet measuring means for measuring the size of the signal packets stored in said at least one of said at least two second analog memory means (Y);
   at least one signal comparator means for comparing outputs of said at least one signal packet measuring means and generating digital output bits (d(i));
   at least one sample and hold circuit for holding an analog signal level measured by said at least one signal packet measuring means and for supplying an input to said at least one comparator means; and
   a shift timing controller for controlling the shift timing of a plurality of shift registers including said recursive shift register, in accordance with the output digital bit determined by said at least one comparator means, in order to execute an addition of the signal packets by partially shifting said recursive shift register or in order to execute an addition transferring output signal packets of said first analog memory means (X) to one of a plurality of memory slots at a selected timing, said memory slots being each formed of said virtual memory media.

3. An analog to digital converter according to claim 2, wherein at least one input signal packet has been inputted to said memory slots at the starting timing of conversion; and
   the output signal packets of said first analog memory means (X) is selectively added to one of said memory slots including the memory slots which initially store input signal packets, directly or indirectly.

4. An analog to digital converter according to claim 2, wherein at least one input signal packet is measured by said signal packet measuring means and stored in said sample and hold circuit prior to the starting timing of conversion to provide an input signal level to said comparator means; and
   the output signal packets of said first analog memory means are selectively added to one of said memory slots which does not hold input signal packets stored therein.

5. An analog to digital converter according to claim 4, wherein the input signal packets are routed to the outside of said convertor after said input signal packet is measured by said signal packet measuring means.

* * * * *